US007223990B2

United States Patent
Lee et al.

(10) Patent No.: US 7,223,990 B2
(45) Date of Patent: May 29, 2007

(54) ION BEAM IRRADIATION DEVICE

(75) Inventors: Yun Bok Lee, Seoul (KR); Yong Sung Ham, Anyang-si (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/736,677

(22) Filed: Dec. 17, 2003

(65) Prior Publication Data

US 2004/0124371 A1 Jul. 1, 2004

(30) Foreign Application Priority Data

Dec. 27, 2002 (KR) ............... 10-2002-0085414

(51) Int. Cl.
*H01J 37/00* (2006.01)
(52) U.S. Cl. .............................. 250/492.21; 315/111.81
(58) Field of Classification Search ........... 250/492.23, 250/492.3; 204/192.1; 315/111.81
See application file for complete search history.

(56) References Cited

U.S. PATENT DOCUMENTS

| 4,449,051 | A | * | 5/1984 | Berkowitz ............... 250/492.2 |
| 4,634,931 | A | * | 1/1987 | Taya et al. ............. 315/111.81 |
| 5,086,015 | A | * | 2/1992 | Itoh et al. .............. 204/192.34 |
| 5,753,923 | A | * | 5/1998 | Mera et al. .............. 250/443.1 |
| 5,770,826 | A | * | 6/1998 | Chaudhari et al. ..... 204/157.15 |
| 5,814,194 | A | * | 9/1998 | Deguchi et al. ......... 204/192.1 |
| 6,236,163 | B1 | * | 5/2001 | Maishev et al. ........ 315/111.81 |
| 6,238,582 | B1 | * | 5/2001 | Williams et al. ............. 216/22 |

* cited by examiner

*Primary Examiner*—David Vanore
(74) *Attorney, Agent, or Firm*—McKenna Long & Aldridge LLP

(57) ABSTRACT

Disclosed is an ion beam irradiation device including a holder supporting a substrate; and an ion beam source that is a predetermined distance from the substrate and inclined to be substantially parallel with the substrate and that irradiates the substrate with an ion beam.

17 Claims, 6 Drawing Sheets

ION BEAM IRRADIATION DEVICE

This application claims the benefit of Korean Patent Application No. 2002-85414, filed on Dec. 27, 2002, which is hereby incorporated by reference for all purposes as if fully set forth herein.

BACKGROUND OF THE INVENTION

1. Field of the Invention

The present invention relates to an ion beam irradiation device, and more particularly, to an ion beam irradiation device for irradiating ion beams onto an alignment layer in the manufacturing process of a liquid crystal display (LCD), thereby providing uniform liquid crystal orientation.

2. Description of the Related Art

Generally, cathode ray tubes (CRT) have been widely used to display image information. However, CRTs have many disadvantages, including being heavy and large for its screen size.

In addition, as the electronics industry quickly advances, display devices that have been used in limited applications such as for TVs are now widely employed in a variety of applications such as for personal computers, laptop computers, mobile devices, and on dashboards of vehicles. Furthermore, with the development of information and communication technology that facilitates the transmission of a large amount of video information, next generation displays that can process and display the large amount of video information are becoming more important.

Among next generation displays, liquid crystal displays (LCD) are the most attractive because LCD have many advantages including being light weight, low power, slim, compact, and low price.

The resolution of the LCD is superior to that of other flat displays, and it has a fast response speed that is as fast as a CRT for displaying a motion picture.

LCDs are driven using the optical anisotropy and polarization characteristics of a liquid crystal. Because a liquid crystal molecule has a structure that is slim and long, it has a specific orientation and polarity when it is arranged. The orientation of the liquid crystal molecule can be adjusted by applying an electromagnetic field thereto. Accordingly, by adjusting the orientation of the liquid crystal molecule, the liquid crystal molecule can selectively transmit or block light according to the molecules orientation, by which a color image may be realized.

FIG. 1 shows a schematic view of a conventional LCD. In FIG. 1, the LCD 100 include lower and upper substrates 101 and 102, and a liquid crystal layer 190 disposed between the lower and upper substrates 101 and 102. The structure of the lower and upper substrates 101 and 102 will be briefly described below.

First, the lower substrate 101 includes a gate electrode 121 formed of a conductive material such as a metal on a first transparent substrate 111 and a gate insulating layer 130 formed of a silicon nitride (SiNx) layer or a silicon oxide (SiOx) layer that may be deposited on the first transparent substrate 111 while covering the gate electrode 121.

An active layer 141 may be formed of amorphous silicon on a portion of the gate insulating layer 130 corresponding to the gate electrode 121, and ohmic contact layers 151 and 152 that are doped with impurities are formed of amorphous silicon are formed on the active layer 141.

Source and drain electrodes 161 and 162 are formed of a conductive material such as a metal on the ohmic contact layers 151 and 152. The source, drain, and gate electrodes 161, 162, and 121 define a thin film transistor (TFT).

A passivation layer 170 is formed of a silicon nitride layer, a silicon oxide layer, or an organic insulating layer on the gate insulating layer 130 while covering the source and drain electrodes 161 and 162. In addition, the passivation layer 170 has a contact hole 171 exposing a surface of the drain electrode 162. A pixel electrode 181 is formed of a transparent conductive material on a pixel region of the passivation layer 170 such that the pixel electrode 181 is connected to the drain electrode 162 through the contact hole 171.

Formed on the pixel electrode 181 is a first alignment layer 191 formed of a polyimide-based material. The exposed surface of the first alignment layer 191 may be rubbed in a predetermined orientation.

The gate electrode 121 is connected to a gate line and the source electrode 161 is connected to a data line. The gate line and the data line perpendicularly cross each other to define the pixel region.

The upper substrate 102 is disposed opposite the lower substrate 101. The upper substrate 102 has a second transparent substrate 110 disposed opposite the first transparent substrate 111 with a predetermined space in between.

Disposed on the second transparent substrate 110 is a black matrix 120 corresponding to the TFT that prevents light from leaking from a non-pixel region.

A color filter 131 formed of alternately arranged red (R), green (G), and blue (B) colors is formed on the second transparent substrate 110 covering the black matrix 120. One color of the color filter 131 corresponds to one pixel region. The color filter 131 may be formed through a dyeing process, a printing process, a pigment dispersion process, or an electrodeposition process.

Formed on the color filter 131 is a common electrode 140 formed of a transparent conductive material, on which a second alignment layer 150 of a polyimide-based material is formed and rubbed to have a predetermined orientation.

The liquid crystal layer 190 is formed between the first and second alignment layers 191 and 150. Initial orientation of the liquid crystal molecules of the liquid crystal layer 190 are determined by the orientation of the first and second alignment layers 191 and 150.

A process of forming the alignment layers to determine the initial orientation of the liquid crystal molecules in the LCD will be described below.

First, a process for depositing an alignment layer and arranging the alignment layer in a predetermined orientation is carried out.

A polyimide-based organic material is generally used for the alignment layer and a rubbing process may be used for the arrangement of the alignment layer.

In the rubbing process, a polyimide-based organic material is first coated on a substrate and then is aligned after a solvent is vaporized at a temperature of about 60–80□. Afterwards, the organic material is hardened at a temperature of about 80–120□, thereby forming a polyimide alignment layer. Then, the alignment layer is rubbed in a predetermined direction with a rubbing cloth such as velvet to form orientation patterns. The rubbing process has several advantages, including a simple process, mass producability, stable orientation, and easy control of a pretilt angle.

However, because the rubbing process is carried out by the rubbing cloth directly contacting the alignment layer, a cell may be contaminated by particles generated by the rubbing, and the TFT device on the substrate may be damaged due to the resultant static electricity. Therefore, an additional cleaning process is required. Furthermore, when the rubbing process is applied to an LCD having a large-sized screen, the orientation of the alignment layer may be non-uniformly realized, deteriorating the yield of the LCDs.

To solve the above-described problems of the rubbing process, non-rubbing orientation techniques have been proposed.

Examples of non-rubbing orientation techniques are a process using a Langmuir-Blodgett film, a light orientation process using ultraviolet ray irradiation, a process using an inclined deposition of $SiO_2$, a process using a micro-groove formed through a photolithography process, and a process using ion beam irradiation.

Among these processes, the ion beam irradiation process has advantages in that a conventional orientation material may be used, and it may be applied to the process of making an LCD having a large-sized screen while overcoming the problems caused by the rubbing process.

FIG. 2 shows a schematic view illustrating a conventional ion beam irradiation device for forming an alignment layer. As shown in the drawing, a conventional ion beam irradiation device 260 is divided into three regions: a plasma generation region 203 where injected gas is ionized into ions and electrons to generate plasma; an ion beam acceleration region 206 where the ions are converted into a beam and accelerated; and a beam irradiation region 211 where the accelerated ion beam 210 irradiates a substrate. The injected gas is ionized in the plasma generation region 203, and the ions are discharged, accelerated, and irradiated to the substrate 220. The ion beam irradiation device 260 is configured such that the ion beam 210 irradiates the substrate 220 fixed on a holder 221 in a vacuum container 240.

The ion beam irradiation device 260 includes an ion beam source 200, the vacuum container 240, and the holder 221. The ion beam source 200 includes a cathode 201, an anode 202, an ion beam discharge medium 204, and an ion beam accelerating medium 205. The vacuum container 240 is designed to allow the ion beam 210 generated from the ion beam source 200 to irradiate the substrate 220 while making a straight advance. In addition, the holder 221 holds the substrate 220 so that the substrate can maintain a predetermined angle in the vacuum container 240.

Although not shown in the drawing, a shutter may be disposed between the ion beam source 200 and the substrate 220 to adjust the irradiation time of the ion beam on the substrate 220.

The ion beam source 200 generates ions and forms the ion beam 210. Injected gas is ionized by a voltage difference between the cathode 201 and the anode 202 to generate plasma containing electrons and ions. The ions in the generated plasma pass through the ion beam discharge medium 204 by way of a discharge electrode, and are then discharged as the ion beam 210. The ion beam 210 discharged from the plasma is accelerated by an electric field applied to the ion beam accelerating medium 205 and then irradiates the substrate 220 at a predetermined angle.

The substrate 220 is inclined at a predetermined angle with respect to the irradiated ion beam 210. As a result, an alignment layer deposited on the substrate 220 is formed in a predetermined orientation pattern by the ion beam 210, thereby determining an initial orientation (i.e., pretilt angle) of liquid crystal molecules.

The chemical structure of the polyimide organic material used for the alignment layer is divided into a main chain and a side chain. The main chain functions to arrange the liquid crystal molecules in a particular direction, and the side chain functions to form the pretilt angle. Particularly, the side chain is designed to be cut at a predetermined portion by reacting with the irradiated ion beam so that the liquid crystal molecules can be oriented with a specific orientation.

As described above, the ion beam 210 generated from the ion beam source 200 is discharged in a direction normal to the ion beam source 200. The pretilt angle of the liquid crystal molecules is determined by an ion beam irradiation angle $\theta 2$ of the ion beam irradiated on the substrate 220 inclined at a predetermined angle $\theta 1$. The ion beam irradiation angle $\theta 2$ indicates an angle between the ion beam irradiation direction and a direction normal to the substrate 220.

The relationship between the ion beam irradiation angle $\theta 2$ and the pretilt angle is shown in FIG. 3.

FIG. 3, shows that the pretilt angle varies in accordance with the ion beam irradiation angle. That is, when the ion beam irradiation angle is in a range of 40–60°, a maximum value of the pretilt angle is obtained. When the ion beam irradiation angle is less than 40° or greater than 60°, the pretilt angle is less than 5°.

For example, a twisted nematic (TN) LCD requires a pretilt angle of about 5°, and an in-plane switching (IPS) LCD requires a pretilt angle of about 2°. Therefore, for the TN LCD, the ion beam irradiation angle is set to about 40–50°, and for the EPS LCD, it is set to about 10–20°.

Accordingly, to uniformly obtain the desire pretilt angle, the ion beam should be irradiated with an appropriate irradiation angle and with a uniform energy. To obtain a desired pretilt angle by the ion beam discharged from the ion beam source in a direction perpendicular to longitudinal axes of the discharge and accelerating media and irradiated on the alignment layer, the substrate should be appropriately inclined so that the ion beam can reach the substrate with a desired irradiation angle. However, when the substrate is inclined, the distances from the ion beam source to upper and lower surfaces of the substrate is not uniform, and the ion beam effect is varied from the upper portion to the lower portion.

FIG. 4 shows a relationship between the ion beam source and the substrate in the conventional ion beam irradiation device for forming the alignment layer. As shown in the drawing, the distance where an ion beam 310 discharged from the ion beam source 300 reaches the surface of a substrate 320 through a penetration part 301 varies in accordance with a location of the surface of the substrate 320. Because the substrate 320 is inclined at a predetermined angle $\theta 1$, the distance from the ion beam source 300 to the substrate 320 varies from a minimum length Lmin to a maximum length Lmax along a vertical direction of the substrate 320.

As a result, there may be a difference in energy of the ion beam 310 landing on the surface of the alignment layer and deposited on the substrate 320. The energy is proportional to the number of ion beams 310 per unit area and a velocity of the ion beam 310. As the traveling distance of the ion beam increases, the velocity increases.

Accordingly, a chance of collision between the particles at a portion of the surface that is far from the ion beam source 300 is increased, and straightness and intensity of energy of the particle beam deteriorates, thereby deteriorating the orientation effect. As a result, the alignment layer is not uniformly formed.

SUMMARY OF THE INVENTION

Accordingly, the present invention is directed to an ion beam irradiation device that substantially obviates one or more problems due to limitations and disadvantages of the related art.

An advantage of the present invention is to provide an ion beam irradiation device that can form an alignment layer having uniform orientation characteristics throughout its whole surface by irradiating an identical intensity of ion beam energy on the whole surface of the alignment layer deposited on a substrate.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these advantages and in accordance with the purpose of the invention, as embodied and broadly described herein, there is provided an ion beam irradiation device including a holder supporting a substrate; and an ion beam source that is a predetermined distance from the substrate and inclined to be substantially parallel with the substrate and that irradiates the substrate with an ion beam.

In another aspect of the present invention, a method of irradiating a substrate with an ion beam is disclosed including supporting a substrate with an alignment layer at a first angle; producing ion beams to irradiate the whole substrate with ions, wherein the ion beams strike the substrate with the same angle and energy across the substrate, and wherein the ion beams all travel substantially the same distance.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

In the drawings.

DETAILED DESCRIPTION OF THE INVENTION

Reference will now be made in detail to embodiments of the present invention, examples of which are illustrated in the accompanying drawings.

Figure 1:
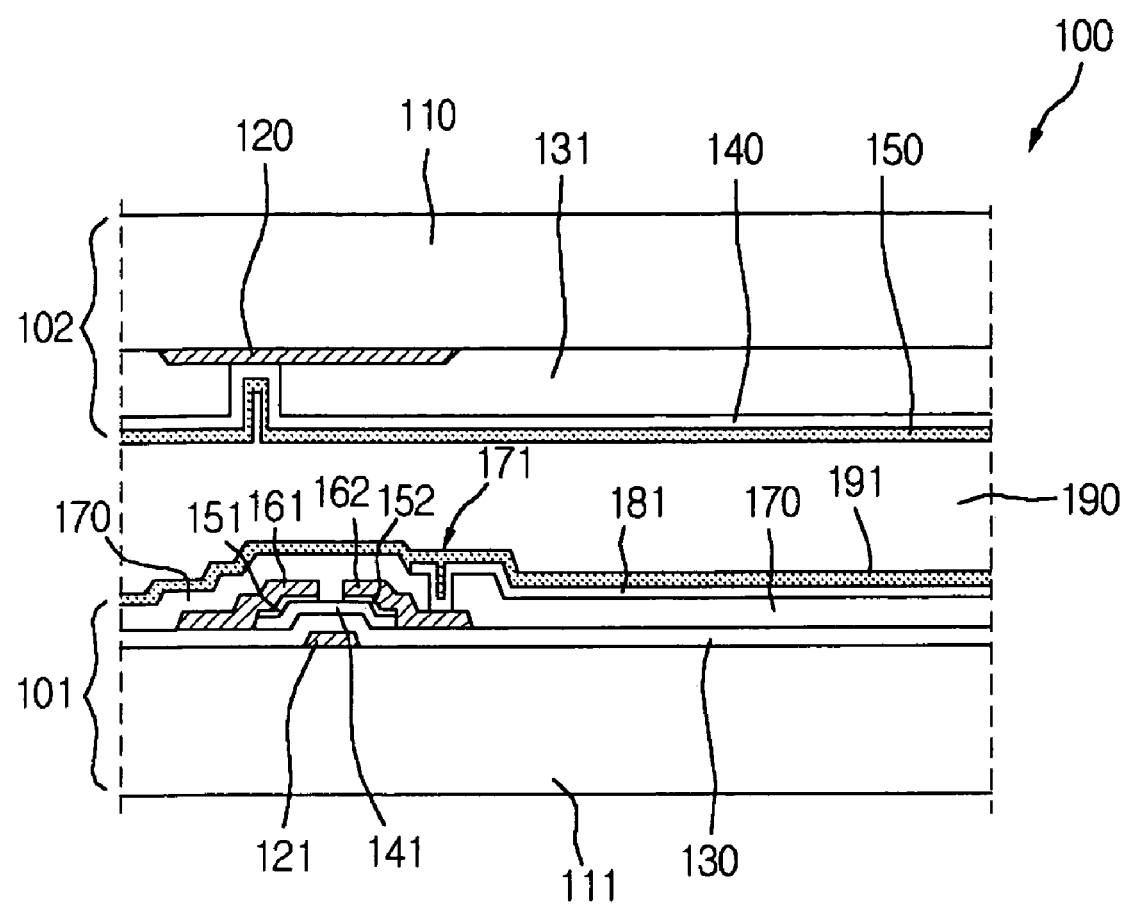
FIG. 1 is a schematic sectional view of a conventional liquid crystal display.
Figure 2:
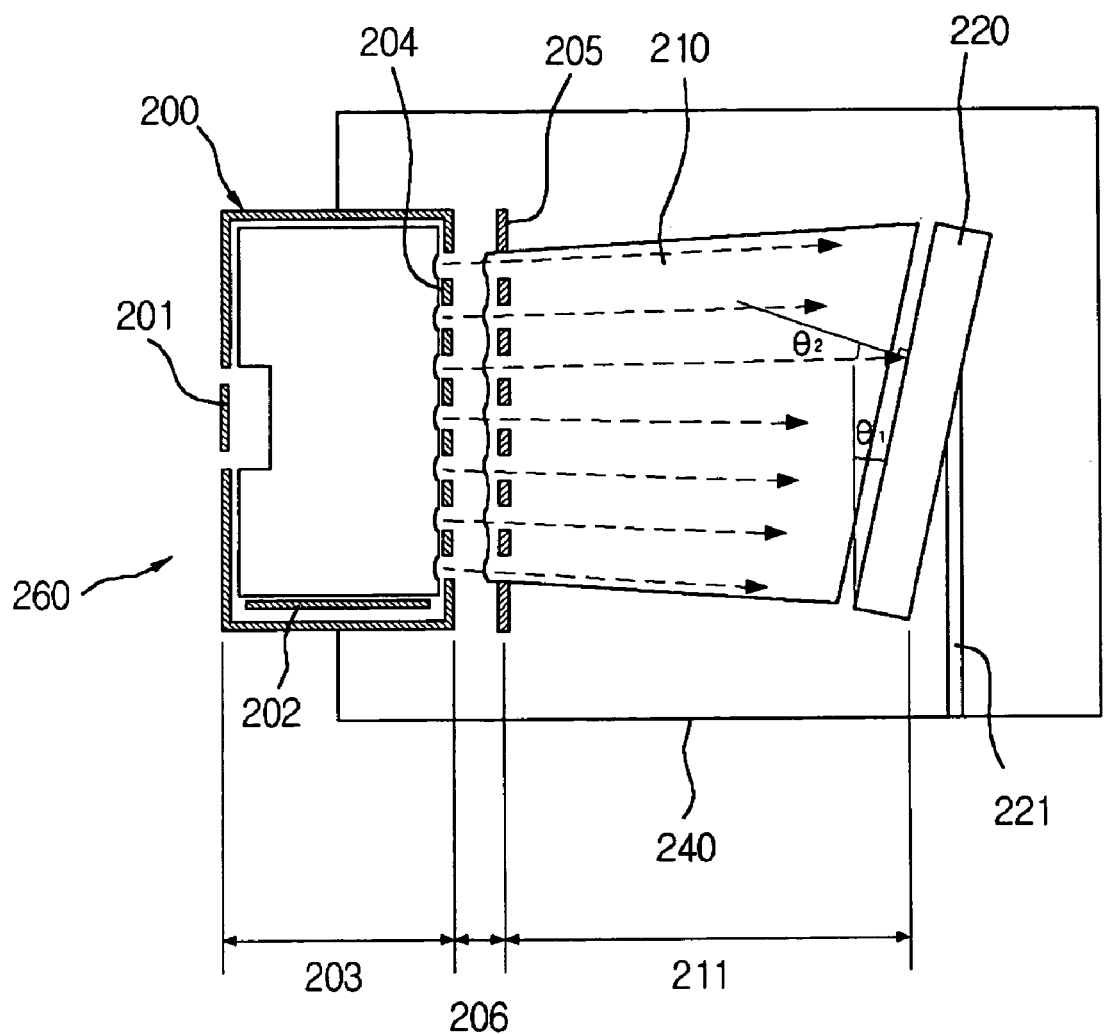
FIG. 2 is a view of a conventional ion beam irradiation device.
Figure 3:
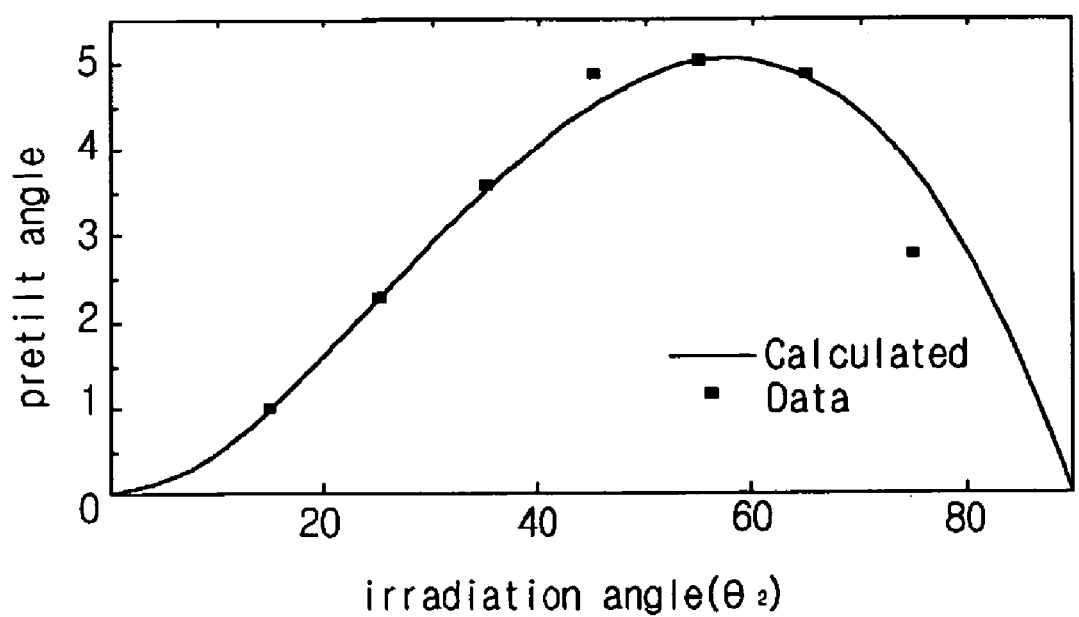
FIG. 3 is a graph illustrating a relationship between an irradiation angle and a pretilt angle in a conventional ion beam irradiation device.
Figure 4:
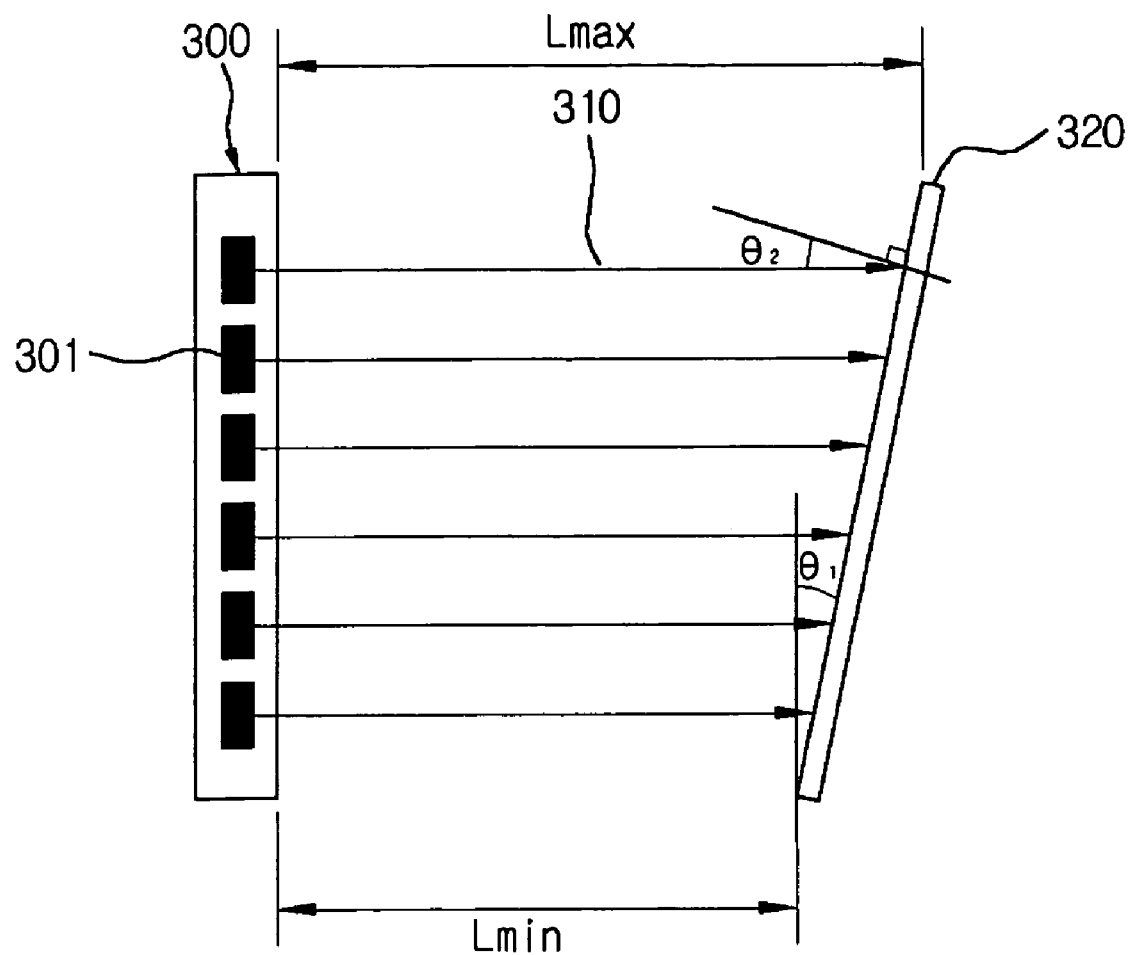
FIG. 4 is a view illustrating a relationship between an ion beam source and a substrate in a conventional ion beam irradiation device.
Figure 5:
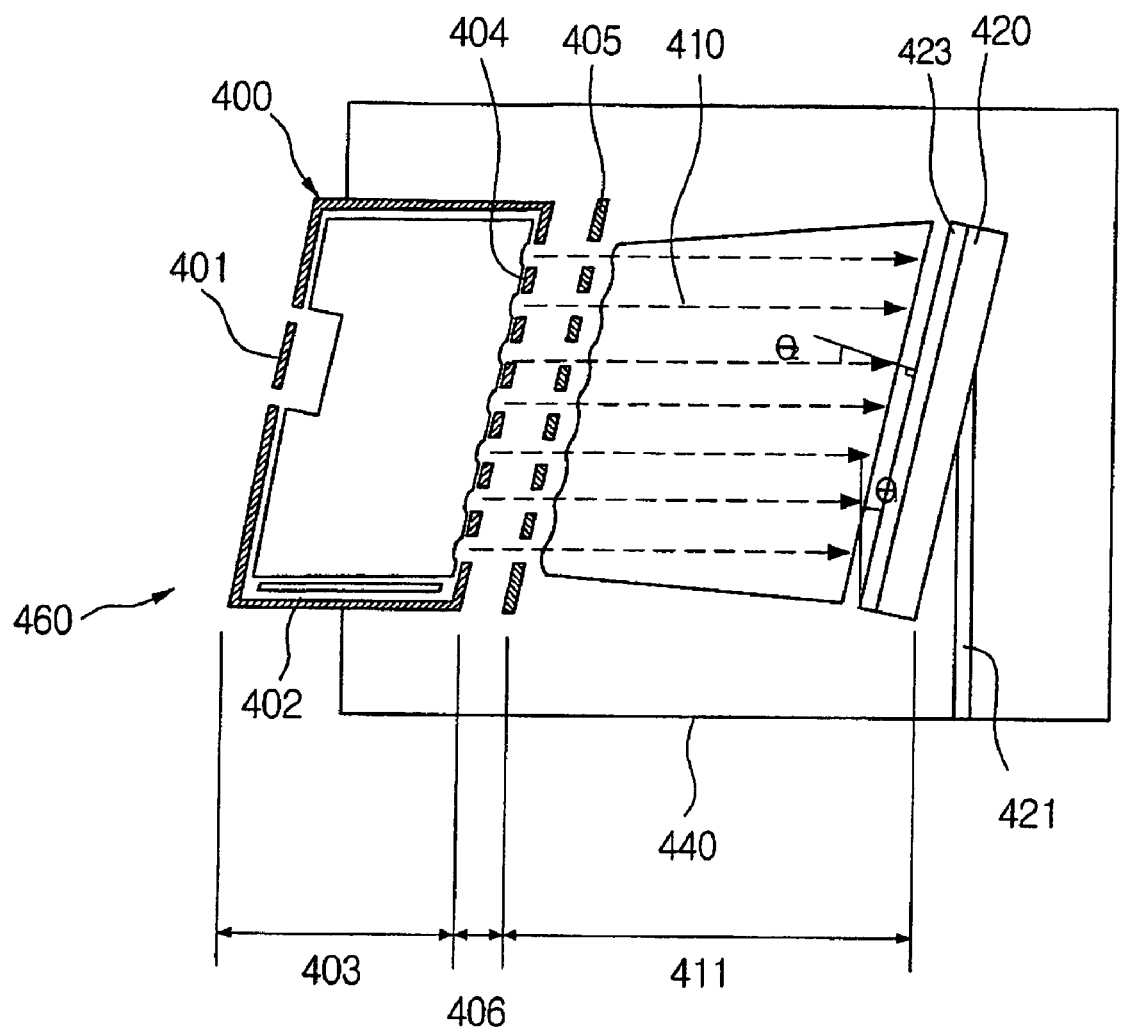
FIG. 5 is a schematic view of an ion beam irradiation device according to an embodiment of the present invention.

FIG. 5 shows an ion beam irradiation device according to an embodiment of the present invention. As shown in the drawing, an ion beam irradiation device 460 is divided into three regions: a plasma generation region 403 where injected gas is ionized into ions and electrons to generate plasma; an ion beam discharge/acceleration region 406 where the ions are discharged as a beam and accelerated; and a beam irradiation region 411 where the accelerated ion beam 410 irradiate a substrate 420. The injected gas is ionized in the plasma generation region 403, and the ions are discharged, accelerated, and irradiated to the substrate 420. The ion beam irradiation device 460 is designed such that the ion beam 410 irradiates the substrate 420 fixed on a holder 421 in a vacuum container 440.

The ion beam irradiation device 460 includes an ion beam source 400, the vacuum container 440, and the holder 421. The ion beam source 400 includes a cathode 401, an anode 402, an ion beam discharge medium 404, and an ion beam accelerating medium 405. The vacuum container 440 is designed to allow the ion beam 410 generated from the ion beam source 400 irradiates the substrate 420 while making a straight advance. In addition, the holder 421 holds the substrate 420 so that the substrate 420 can maintain a predetermined angle in the vacuum container 440. The gas injected into the ion beam source 400 to generate the ion beam 410 may be an inert gas such as Ar, Kr, and Xe.

Although not shown in the drawing, a shutter may be disposed between the ion beam source 400 and the substrate 420 to adjust the irradiation time of the ion beam on the substrate 420.

The ion beam source 400 generates ions and forms the ion beam 410. The injected gas is ionized by a voltage difference between the cathode 401 and the anode 402 to generate plasma containing electrons and ions. The ions in the generated plasma pass through the ion beam discharge medium 404 by way of a discharge electrode, and are then discharged as the ion beam 410. The ion beam 410 discharged from the discharged plasma is accelerated by an electric field applied to the ion beam accelerating medium 405 and then irradiates the substrate 420 at a predetermined angle.

The ion beam discharge medium 404 and the beam accelerating medium 405 are both inclined to be in parallel with the inclined substrate 420 so that the ion beam 410 discharged from the ion beam discharge medium 404 and accelerated by the beam accelerating medium 405 may be irradiated across the whole surface of the substrate 420 with identical energy.

As the ion beam 410 acting on the surface of the substrate 420 has uniform energy, the alignment layer formed on the substrate 420 has a uniform orientation characteristic.

In another embodiment of the present invention, it is also possible that the ion beam discharge medium 404 is designed not to be inclined but vertically disposed such that the ion beam 410 may be discharged in a direction normal to a longitudinal axis of the ion beam discharge medium 404. The ion beam accelerating medium 405 is designed to be in parallel with the substrate 420 such that the distance that the ion beam accelerated from the ion beam accelerating medium 405 travels to the substrate 420 becomes identical across the substrate 420.

In this case, the ion beam 410 passing through a penetrating portion of the ion beam accelerating medium 405 is discharged with a predetermined angle according to the inclined angle of the ion beam accelerating medium 405 inclined with respect to a direction normal to the longitudinal axis of the ion beam accelerating medium 405.

The discharge of the ion beam in a direction according to the inclined angle means that the discharge angle of the ion beam in a direction normal to the ion beam source is increased as the inclined angle of the substrate is increased. That is, the ion beam is discharged with a predetermined angle with respect to a direction normal to the ion beam source 400 so that the ion beam 410 may be irradiated with a desired angle with respect to the substrate 420.

The chemical structure of the polyimide organic material used for the alignment layer is divided into a main chain and a side chain. The main chain functions to arrange the liquid crystal molecules in a particular direction, and the side chain functions to form the pretilt angle.

Particularly, the side chain is designed to be cut at a predetermined portion by reacting with the irradiated ion beam so that the liquid crystal molecules can be oriented with a specific orientation.

Because the traveling distances from the ion beam source 400 to upper and lower portions of the substrate 420 are identical to each other, in the ion beam irradiation device described above, the ion beam uniformly affects the whole surface of the substrate 420.

Figure 6:
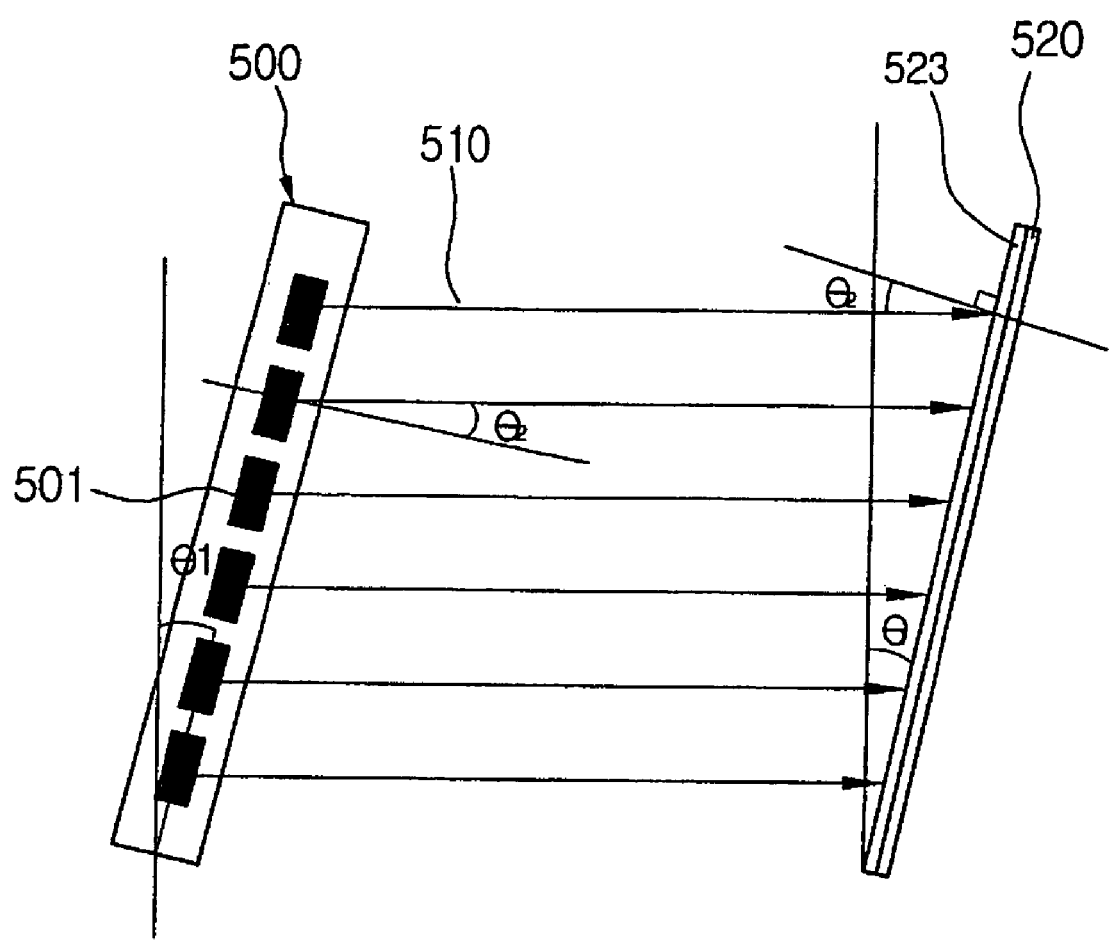
FIG. 6 is a view illustrating a relationship between an ion beam source and a substrate in an ion beam irradiation device according to an embodiment of the present invention.

FIG. 6 shows the relationship between the ion beam source and the substrate in the ion beam irradiation device according to another embodiment of the present invention.

In the drawing, the plasma generation region, the cathode, and the anode are omitted. Only a path where the ion beam irradiates through the ion beam discharging medium and the penetrating portion 501 of the ion beam accelerating medium are illustrated.

An ion beam source 500 may be inclined at a predetermined angle θ1 identical to an inclined angle of a substrate 520 that is inclined to form a pretilt angle in the liquid crystal. Accordingly, an ion beam 510 irradiated through a penetrating portion 501 of the ion beam source 500 reaches the surface of the substrate 520. At this point, the distance that the ion beam 510 travels becomes uniform across the substrate 520.

The ion beam 510 passing through the penetrating portion 501 of the ion beam source 500 is discharged with a predetermined angle according to the inclined angle of the ion beam source 500. Therefore, the pretilt angle of the liquid crystal molecule is determined by the irradiation angle θ2 of the ion beam 510.

Because the distances that the ion beams 510 travel between the ion beam source 500 and the substrate 520 are uniform regardless of where it lands on the substrate 520, the number of ion beams landed in a unit area and the velocity of the ion beam 510 become uniform across whole surface of the substrate 520. Accordingly, the ion beam energies applied to upper and lower areas of the alignment layer become identical to each other.

As described above, by orienting the ion beam source 500 to be parallel to the substrate 520 and radiating the ion beam 510 on an alignment layer at a predetermined angle θ2 with respect to the normal of the ion beam source 500, the liquid crystal molecules oriented by the alignment layer have a uniform pretilt angle.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An ion beam irradiation device comprising:
   a holder supporting a substrate;
   an ion beam path; and
   an ion beam source that is a predetermined distance from the substrate and that irradiates the substrate with an ion beam along the ion beam path, wherein the ion beam is discharged from the ion beam source with an incidence angle with respect to the ion beam source that is greater than about 0° and the emitting surface of the ion beam source is inclined to be substantially parallel with the substrate and wherein substantially all irradiated ions follow paths that are substantially parallel and straight.

2. The ion beam irradiation device according to claim 1, wherein the ion beam source comprises:
   an ionizer that ionizes injected gas into ions and electrons;
   a discharger that discharges the ions as the ion beam; and
   an accelerator that accelerates the discharged ion beam towards the substrate.

3. The ion beam irradiation device according to claim 2, wherein the accelerator is substantially parallel with the substrate.

4. The ion beam irradiation device according to claim 2, wherein the discharger is substantially parallel with the substrate.

5. The ion beam irradiation device according to claim 2, wherein the ionizer is substantially parallel with the substrate.

6. The ion beam irradiation device according to claim 2, wherein the discharger and the accelerator are substantially parallel with the substrate and the ionizer inclined at an angle substantially different from the accelerator and discharger.

7. The ion beam irradiation device according to claim 1, wherein the substrate comprises an alignment layer formed on a surface thereof.

8. The ion beam irradiation device according to claim 1, wherein the ion beam is formed from an inert gas selected from the group consisting of Ar, Kr, and Xe.

9. The ion beam irradiation device according to claim 1, wherein the ion beam irradiates the substrate with an incidence angle of about 40°–50°.

10. The ion beam irradiation device according to claim 1, wherein the ion beam irradiates the substrate with an incidence angle of about 40°–60°.

11. The ion beam irradiation device according to claim 1, wherein the ion beam irradiates the substrate with an incidence angle of about 10°–20°.

12. A method of irradiating a substrate with an ion beam comprising:
   supporting a substrate with an alignment layer at a first angle;
   producing ion beams to simultaneously irradiate the whole substrate with ions, wherein the ion beams strike the substrate with substantially the same incidence angle and energy across the substrate, and wherein the ion beams all travel substantially the same distance and the incidence angle is greater than about 0° and wherein substantially all irradiated ions follow paths that are substantially parallel and straight.

13. The method according to claim 12, wherein producing ion beams comprises:
   ionizing an injected gas into ions and electrons;

discharging the ions as the ion beams; and accelerating the discharged ion beams towards the substrate.

14. The method according to claim 12, wherein the injected gas is selected from the group of Ar, Kr, and Xe.

15. The method according to claim 12, wherein the ion beam irradiates the substrate with an incidence angle of about 40°–50°.

16. The method according to claim 12, wherein the ion beam irradiates the substrate with an incidence angle of about 40°–60°.

17. The method according to claim 12, wherein the ion beam irradiates the substrate with an incidence angle of about 10°–20°.

* * * * *